United States Patent
Uemura et al.

(10) Patent No.: US 8,771,834 B2
(45) Date of Patent: *Jul. 8, 2014

(54) FORMED BODY, PRODUCTION METHOD THEREOF, ELECTRONIC DEVICE MEMBER AND ELECTRONIC DEVICE

(71) Applicant: LINTEC Corporation, Tokyo (JP)

(72) Inventors: Kazue Uemura, Tokyo (JP); Takeshi Kondo, Tokyo (JP); Yuta Suzuki, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/826,954

(22) Filed: Mar. 14, 2013

(65) Prior Publication Data

US 2013/0202900 A1 Aug. 8, 2013

Related U.S. Application Data

(63) Continuation of application No. PCT/JP2011/071208, filed on Sep. 16, 2011.

(30) Foreign Application Priority Data

Sep. 21, 2010 (JP) ................................. 2010-210646

(51) Int. Cl.
B32B 27/16 (2006.01)

(52) U.S. Cl.
USPC ........... 428/451; 427/489; 427/496; 427/503; 427/525; 427/527

(58) Field of Classification Search
USPC ........... 427/489, 496, 503, 525, 527; 428/451
See application file for complete search history.

(56) References Cited

U.S. PATENT DOCUMENTS 5,143,747 A 9/1992 Matossian et al.
5,458,753 A 10/1995 Sato et al.
(Continued)

FOREIGN PATENT DOCUMENTS

JP 5-185568 A 7/1993
JP 6-64105 A 3/1994
(Continued)

OTHER PUBLICATIONS

International Search Report, issued in PCT/JP2011/071208, dated Nov. 8, 2011.
(Continued)

Primary Examiner — Dhirajlal S Nakarani
(74) Attorney, Agent, or Firm — Birch, Stewart, Kolasch & Birch, LLP

(57) ABSTRACT

The present invention is a formed article sequentially comprising a base layer, a primer layer that includes a hydroxyl group-containing polymer, and a gas barrier layer, the gas barrier layer being formed of a material that includes at least an oxygen atom and a silicon atom, a surface layer part of the gas barrier layer having an oxygen atom content rate of 60 to 75%, a nitrogen atom content rate of 0 to 10%, and a silicon atom content rate of 25 to 35%, based on a total content rate of oxygen atoms, nitrogen atoms, and silicon atoms, and the surface layer part of the gas barrier layer having a film density of 2.4 to 4.0 g/cm$^3$. According to the present invention, provided is a formed article, a method for producing the same, an electronic device member including the formed article, and an electronic device including the electronic device member, with an excellent gas barrier capability and excellent transparency.

19 Claims, 4 Drawing Sheets

(56) References Cited

U.S. PATENT DOCUMENTS

| | | | |
|---|---|---|---|
| 5,907,382 A | 5/1999 | Kajiura et al. | |
| 6,352,931 B1 | 3/2002 | Seta et al. | |
| 6,416,817 B1 | 7/2002 | Rangwalla et al. | |
| 2002/0034885 A1 | 3/2002 | Shindo | |
| 2002/0059899 A1 | 5/2002 | Seta et al. | |
| 2002/0063830 A1 | 5/2002 | Callegari et al. | |
| 2002/0102843 A1 | 8/2002 | Seta et al. | |
| 2003/0224611 A1 | 12/2003 | Seta et al. | |
| 2004/0046497 A1 | 3/2004 | Schaepkens et al. | |
| 2004/0146660 A1 | 7/2004 | Goodwin et al. | |
| 2004/0265554 A1 | 12/2004 | Miyadera et al. | |
| 2005/0017633 A1 | 1/2005 | Miyadera | |
| 2005/0082674 A1 | 4/2005 | Seta et al. | |
| 2005/0202259 A1 | 9/2005 | Korevaar et al. | |
| 2005/0287307 A1 | 12/2005 | Singh et al. | |
| 2006/0017162 A1 | 1/2006 | Seta et al. | |
| 2006/0232735 A1 | 10/2006 | Hokazono et al. | |
| 2007/0268089 A1 | 11/2007 | McKenzie et al. | |
| 2008/0096014 A1 | 4/2008 | Griesser et al. | |
| 2009/0021150 A1 | 1/2009 | Kim et al. | |
| 2009/0022907 A1 | 1/2009 | Kim et al. | |
| 2009/0110892 A1 | 4/2009 | Erlat et al. | |
| 2009/0130463 A1 | 5/2009 | Albaugh et al. | |
| 2009/0139564 A1 | 6/2009 | Miyaji et al. | |
| 2009/0148633 A1 | 6/2009 | Inagaki et al. | |
| 2010/0003483 A1 | 1/2010 | Fukuda | |
| 2011/0185948 A1 | 8/2011 | Uemura et al. | |
| 2011/0189450 A1 | 8/2011 | Hoshi et al. | |
| 2011/0274933 A1 | 11/2011 | Hoshi et al. | |
| 2012/0064321 A1 | 3/2012 | Suzuki et al. | |
| 2012/0101221 A1 | 4/2012 | Hoshi et al. | |
| 2012/0108761 A1 | 5/2012 | Hoshi et al. | |
| 2012/0295120 A1 | 11/2012 | Nagamoto et al. | |

FOREIGN PATENT DOCUMENTS

| | | | |
|---|---|---|---|
| JP | 6-187833 A | 7/1994 | |
| JP | 8-45452 A | 2/1996 | |
| JP | 8-57560 A | 3/1996 | |
| JP | 8-174748 A | 7/1996 | |
| JP | 8-302043 A | 11/1996 | |
| JP | 09-010687 A | 1/1997 | |
| JP | 9-26755 A | 1/1997 | |
| JP | 9-124807 A | 5/1997 | |
| JP | 10-244613 A | 9/1998 | |
| JP | 10-249990 A | 9/1998 | |
| JP | 10-305542 A | 11/1998 | |
| JP | 2000-246830 A | 9/2000 | |
| JP | 2000-254996 A | 9/2000 | |
| JP | 2000-260870 A | 9/2000 | |
| JP | 2000-338901 A | 12/2000 | |
| JP | 2001-119051 A | 4/2001 | |
| JP | 2002-18246 A | 1/2002 | |
| JP | 2002-105676 A | 4/2002 | |
| JP | 2003-8179 A | 1/2003 | |
| JP | 2003-154596 A | 5/2003 | |
| JP | 2003-525995 A | 9/2003 | |
| JP | 2003-347570 A | 12/2003 | |
| JP | 2004-119138 A | 4/2004 | |
| JP | 2004-527642 A | 9/2004 | |
| JP | 2004-530790 A | 10/2004 | |
| JP | 2004-322489 A | 11/2004 | |
| JP | 2004-352966 A | 12/2004 | |
| JP | 2005-88431 A | 4/2005 | |
| JP | 2005-104025 A | 4/2005 | |
| JP | 2005-119155 A | 5/2005 | |
| JP | 2005-119160 A | 5/2005 | |
| JP | 2005-169994 A | 6/2005 | |
| JP | 2005-231039 A | 9/2005 | |
| JP | 2005-240061 A | 9/2005 | |
| JP | 2005-537963 A | 12/2005 | |
| JP | 2006-35737 A | 2/2006 | |
| JP | 2006-52376 A | 2/2006 | |
| JP | 2006-70238 A | 3/2006 | |
| JP | 2006-123306 A | 5/2006 | |
| JP | 2006-123307 A | 5/2006 | |
| JP | 2006-264118 A | 10/2006 | |
| JP | 2007-22075 A | 2/2007 | |
| JP | 2007-42616 A | 2/2007 | |
| JP | 2007-65644 A | 3/2007 | |
| JP | 2007-237588 A | 9/2007 | |
| JP | 2007-528447 A | 10/2007 | |
| JP | 2007-283726 A | 11/2007 | |
| JP | 2008-15500 A | 1/2008 | |
| JP | 2008-504687 A | 2/2008 | |
| JP | 2008-49601 A | 3/2008 | |
| JP | 2008-62498 A | 3/2008 | |
| JP | 2008-174792 A | 7/2008 | |
| JP | 2008-204683 A | 9/2008 | |
| JP | 2008-235165 A | 10/2008 | |
| JP | 2008-246893 A | 10/2008 | |
| JP | 2008-270115 A | 11/2008 | |
| JP | 2009-110897 A | 5/2009 | |
| JP | 2009-199812 A | 9/2009 | |
| JP | 2009-287006 A | 12/2009 | |
| JP | 2011-718 A | 1/2011 | |
| WO | WO 2006/090602 A1 | 8/2006 | |
| WO | WO 2007-040039 A1 | 4/2007 | |
| WO | WO 2007/044181 A2 | 4/2007 | |
| WO | WO 2008/096617 A1 | 8/2008 | |
| WO | WO 2010/021326 A1 | 2/2010 | |
| WO | WO 2010/024378 A1 | 3/2010 | |
| WO | WO 2010/067857 A1 | 6/2010 | |
| WO | WO 2010/107018 A1 | 9/2010 | |
| WO | WO 2010/134609 A1 | 11/2010 | |
| WO | WO 2010/134611 A1 | 11/2010 | |

OTHER PUBLICATIONS

Extended European Search Report issued Aug. 29, 2013, in European Patent Application No. 11765502.7.
Office Action dated May 17, 2013 in U.S. Appl. No. 13/823,688.
International Search Report for International Application No. PCT/JP2009/064457 dated Dec. 1, 2009.
International Search Report for International Application No. PCT/JP2009/070728 dated Feb. 9, 2010.
International Search Report for International Application No. PCT/JP2010/052058 dated Jun. 1, 2010.
International Search Report for International Application No. PCT/JP2010/055064 dated May 11, 2010.
International Search Report for International Application No. PCT/JP2010/058668 dated Aug. 10, 2010.
International Search Report for International Application No. PCT/JP2011/051507 dated May 10, 2011 (with English translation).
International Search Report for International Application No. PCT/JP2011/057608 dated Apr. 26, 2011.
International Search Report for International Application No. PCT/JP2011/057610 dated Jul. 5, 2011.
International Search Report for International Application No. PCT/JP2011/071203 dated Nov. 8, 2011.
International Search Report for International Application No. PCT/JP2011/071353 dated Nov. 8, 2011.
Kobayashi et al., "Surface modification of silicone sheets and tubes using plasma-based ion implantation," Surface & Coatings Technology, vol. 201, 2007, pp. 8039-8042.
Nakagawara et al., "Moisture-resistant ZnO transparent conductive films with Ga heavy doping", Applied Physics Letters, vol. 89, 2006, pp. 091904-1-091904-3.
Schauer et al., "Luminescence as a tool for crosslinking determination in plasma polysilylenes prepared from organosilanes", Synthetic Metals, vol. 109, 2000, pp. 321-325.
United States Office Action for copending U.S. Appl. No. 13/055,274 dated Apr. 16, 2013.
United States Office Action for copending U.S. Appl. No. 13/055,274 dated Nov. 7, 2013.
United States Office Action for copending U.S. Appl. No. 13/128,348 dated Feb. 14, 2013.
United States Office Action for copending U.S. Appl. No. 13/128,348 dated Sep. 13, 2013.

(56) References Cited

OTHER PUBLICATIONS

United States Office Action for copending U.S. Appl. No. 13/144,856 dated Mar. 15, 2013.
United States Office Action for copending U.S. Appl. No. 13/144,856 dated Oct. 18, 2013.
United States Office Action for copending U.S. Appl. No. 13/256,143 dated Aug. 6, 2013.
United States Office Action for copending U.S. Appl. No. 13/256,143 dated Nov. 21, 2013.
United States Office Action for copending U.S. Appl. No. 13/321,687 dated Jan. 15, 2014.
United States Office Action for copending U.S. Appl. No. 13/321,687 dated Oct. 8, 2013.
United States Office Action for copending U.S. Appl. No. 13/823,688 dated Feb. 25, 2014.
United States Notice of Allowance and Notice of Allowability for copending U.S. Appl. No. 13/256,143 dated Apr. 29, 2014.

FORMED BODY, PRODUCTION METHOD THEREOF, ELECTRONIC DEVICE MEMBER AND ELECTRONIC DEVICE

CROSS-REFERENCE TO RELATED APPLICATIONS

This application is a Continuation of PCT/JP2011/071208 filed on Sep. 16, 2011, which claims priority under 35 U.S.C. §119(a) to Patent Application No. 2010-210646 filed in Japan on Sep. 21, 2010, all of which are hereby expressly incorporated by reference into the present application.

TECHNICAL FIELD

The invention relates to a formed article, a method for producing the same, an electronic device member that includes the formed article, and an electronic device that includes the electronic device member.

BACKGROUND ART

A polymer formed article (e.g., plastic film) that is inexpensive and exhibits excellent workability has been provided with a desired function, and used in various fields.

For example, a gas barrier plastic film that does not allow water vapor and oxygen to pass through has been used as a food/drug packaging film in order to suppress oxidation and denaturation of proteins, oils, fats, and the like to keep taste and freshness.

In recent years, use of a transparent plastic film as an electrode substrate instead of a glass plate has been studied for displays (e.g., liquid crystal display and electroluminescence (EL) display) in order to implement a reduction in thickness, a reduction in weight, an improvement in flexibility, and the like. However, since a plastic film tends to allow water vapor, oxygen, and the like to pass through as compared with a glass plate, a deterioration in an element provided in a display may easily occur.

In order to solve the above problem, Patent Document 1 proposes a flexible display substrate in which a transparent gas barrier layer formed of a metal oxide is stacked on a transparent plastic film.

However, since the transparent gas barrier layer formed of a metal oxide is stacked on the surface of the transparent plastic film by evaporation (deposition), ion plating, sputtering, or the like, cracks may occur in the gas barrier layer when the substrate is rolled up or bent, so that the gas barrier capability may deteriorate.

Patent Document 2 discloses a method that produces a gas barrier film by forming a polysilazane film on at least one side of a film, and subjecting the polysilazane film to a plasma treatment. When using the method disclosed in Patent Document 2, however, a sufficient gas barrier capability cannot be obtained unless the thickness of the gas barrier layer is increased to a micrometer level. For example, Patent Document 2 states that a water vapor transmission rate of 0.50 g/m²/day was obtained when the gas barrier layer had a thickness of 0.1 μm.

RELATED-ART DOCUMENT

Patent Document

Patent Document 1: JP-A-2000-338901
Patent Document 2: JP-A-2007-237588

SUMMARY OF THE INVENTION

Technical Problem

The invention was conceived in view of the above situation. An object of the invention is to provide a formed article that exhibits an excellent gas barrier capability and excellent transparency, a method for producing the same, an electronic device member that includes the formed article, and an electronic device that includes the electronic device member.

Solution to Problem

The inventors of the invention conducted extensive studies in order to achieve the above object. As a result, the inventors found that a formed article that sequentially includes a base layer, a primer layer that includes a hydroxyl group-containing polymer, and a gas barrier layer, the gas barrier layer being formed of a material that includes at least an oxygen atom and a silicon atom, the surface layer part of the gas barrier layer having a specific oxygen atom content rate, a specific nitrogen atom content rate, a specific silicon atom content rate, and a specific film density, exhibits an excellent gas barrier capability and excellent transparency. The inventors also found that a formed article that exhibits an excellent gas barrier capability and excellent transparency can be easily and efficiently produced by forming a primer layer that includes a hydroxyl group-containing polymer on a base layer, forming a polysilazane compound-containing layer on the primer layer as a gas barrier layer, and implanting ions into the polysilazane compound-containing layer. These findings have led to the completion of the invention.

A first aspect of the invention provides the following formed article (see (1) to (8)).

(1) A formed article sequentially including a base layer, a primer layer that includes a hydroxyl group-containing polymer, and a gas barrier layer, the gas barrier layer being formed of a material that includes at least an oxygen atom and a silicon atom, a surface layer part of the gas barrier layer having an oxygen atom content rate of 60 to 75%, a nitrogen atom content rate of 0 to 10%, and a silicon atom content rate of 25 to 35%, based on a total content rate of oxygen atoms, nitrogen atoms, and silicon atoms, and the surface layer part of the gas barrier layer having a film density of 2.4 to 4.0 g/cm³.
(2) The formed article according to (1), wherein the gas barrier layer is obtained by implanting ions into a polysilazane compound-containing layer.
(3) The formed article according to (1) or (2), wherein the hydroxyl group-containing polymer has a hydroxyl group-containing repeating unit content of 10 mol % or more based on total repeating units.
(4) The formed article according to (2) or (3), wherein the ions are obtained by ionizing at least one gas selected from a group consisting of hydrogen, nitrogen, oxygen, argon, helium, neon, xenon, and krypton.
(5) The formed article according to any one of (2) to (4), wherein the gas barrier layer is obtained by implanting the ions into the polysilazane compound-containing layer by a plasma ion implantation method.
(6) The formed article according to any one of (2) to (5), wherein the polysilazane compound is perhydropolysilazane.
(7) The formed article according to any one of (1) to (6), the formed article having a water vapor transmission rate at a temperature of 40° C. and a relative humidity of 90% of less than 0.10 g/m²/day.

(8) The formed article according to any one of (1) to (7), the formed article having a total light transmittance measured in accordance with JIS K 7361-1 of 90% or more.

A second aspect of the invention provides the following method for producing a formed article (see (9) to (11)).

(9) A method for producing the formed article according to (2), the method including forming a polysilazane compound-containing layer on a primer layer that is formed on a surface of a base layer and includes a hydroxyl group-containing polymer, and implanting ions into a surface area of the polysilazane compound-containing layer.

(10) The method according to (9), including forming a polysilazane compound-containing layer on a primer layer that is formed on a surface of a base layer and includes a hydroxyl group-containing polymer, and implanting ions of at least one gas selected from a group consisting of hydrogen, nitrogen, oxygen, argon, helium, neon, xenon, and krypton into a surface area of the polysilazane compound-containing layer.

(11) The method according to (9), including forming a polysilazane compound-containing layer on a primer layer that is formed on a surface of a base layer and includes a hydroxyl group-containing polymer, and implanting ions of at least one gas selected from a group consisting of hydrogen, nitrogen, oxygen, argon, helium, neon, xenon, and krypton into a surface area of the polysilazane compound-containing layer by a plasma ion implantation method.

A third aspect of the invention provides the following electronic device member (see (12)).

(12) An electronic device member including the formed article according to any one of (1) to (8).

A fourth aspect of the invention provides the following electronic device (see (13)).

(13) An electronic device including the electronic device member according to (12).

Advantageous Effects of the Invention

The formed article according to the aspect of the invention exhibits an excellent gas barrier capability and excellent transparency. Therefore, the formed article may suitably be used as an electronic device member for solar cells, touch panels, electronic paper, displays, and the like.

The method for producing a formed article according to the aspect of the invention can safely and easily produce the formed article according to the aspect of the invention that exhibits an excellent gas barrier capability. The method can also easily achieve an increase in area of the formed article at low cost as compared with the case of forming an inorganic film.

Since the electronic device member according to the aspect of the invention exhibits an excellent gas barrier capability and excellent transparency, the electronic device member may suitably be used for an electronic device (e.g., touch panel, electronic paper, flexible display (e.g., organic/inorganic EL display), and solar cell).

DESCRIPTION OF EMBODIMENTS

Figure 1:
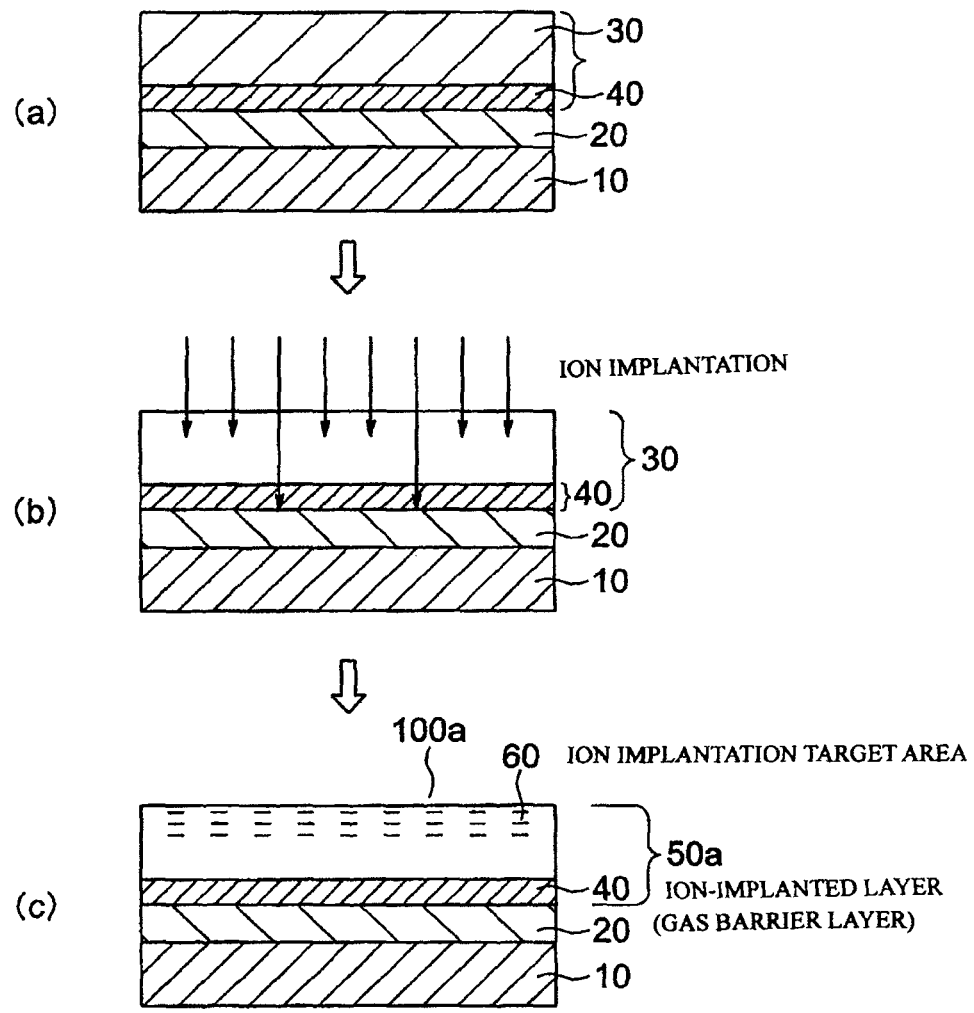
FIGS. 1(a) to 1(c) are cross-sectional views illustrating the layer configuration of a formed article when implanting ions into a polysilazane layer to form a gas barrier layer to obtain a formed article.

A formed article, a method for producing a formed article, an electronic device member, and an electronic device according to the embodiments of the invention are described in detail below.

1) Formed Article

A formed article according to one embodiment of the invention sequentially includes a base layer, a primer layer that includes a hydroxyl group-containing polymer, and a gas barrier layer, the gas barrier layer being formed of a material that includes at least an oxygen atom and a silicon atom, a surface layer part of the gas barrier layer having an oxygen atom content rate of 60 to 75%, a nitrogen atom content rate of 0 to 10%, and a silicon atom content rate of 25 to 35%, based on a total content rate of oxygen atoms, nitrogen atoms, and silicon atoms, and the surface layer part of the gas barrier layer having a film density of 2.4 to 4.0 g/cm$^3$.

Base Layer

The formed article according to one embodiment of the invention includes the base layer. A material for forming the base layer is not particularly limited as long as the material is not a polysilazane compound, and is suitable for the intended use of the formed article. Examples of the material for forming the base layer include polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, aromatic polymers, and the like.

Among these, polyesters, polyamides, polysulfones, polyether sulfones, polyphenylene sulfides, polyallylates, and cycloolefin polymers are preferable due to excellent transparency and versatility. It is more preferable to use polyesters or cycloolefin polymers.

Examples of the polyesters include polyethylene terephthalate, polybuthylene terephthalate, polyethylene naphthalate, polyallylates, and the like.

Examples of the polyamides include wholly aromatic polyamides, nylon 6, nylon 66, nylon copolymers, and the like.

Examples of the cycloolefin polymers include norbornene polymers, monocyclic olefin polymers, cyclic conjugated diene polymers, vinyl alicyclic hydrocarbon polymers, and hydrogenated products thereof. Specific examples of the cycloolefin polymers include APEL (ethylene-cycloolefin copolymer manufactured by Mitsui Chemicals Inc.), ARTON (norbornene polymer manufactured by JSR Corporation), ZEONOR (norbornene polymer manufactured by Zeon Corporation), and the like.

The thickness of the base layer is not particularly limited, and may be determined depending on the intended use of the formed article. The thickness of the base layer is normally 0.5 to 500 µm, and preferably 1 to 100 µm.

Primer Layer that Includes Hydroxyl Group-Containing Polymer

The formed article according to one embodiment of the invention includes the primer layer that includes hydroxyl group-containing polymer (hereinafter may be referred to as "primer layer"), the primer layer being provided between the base layer and the gas barrier layer (described later).

The primer layer improves adhesion between the base layer and the gas barrier layer, as described later. Moreover, when forming the gas barrier layer by implanting ions into a polysilazane compound-containing layer, the primer layer prevents a situation in which ions pass through the polysilazane compound-containing layer, and are implanted into the base layer, whereby the base layer is colored.

The content of the hydroxyl group-containing polymer in the primer layer is preferably 30 wt % or more, and more preferably 50 wt % or more.

The hydroxyl group-containing polymer is not particularly limited as long as the hydroxyl group-containing polymer includes a hydroxyl group. It is preferable that the hydroxyl group-containing polymer be a polymer in which the content of hydroxyl group-containing repeating units is 10 mol % or more, and more preferably 50 mol % or more, based on total repeating units. When the hydroxyl group content is within the above range, interlayer adhesion between the base layer and the gas barrier layer can be improved.

Specific examples of the hydroxyl group-containing polymer include polyvinyl alcohol polymers such as polyvinyl alcohol, polyvinyl butyral, polyvinyl acetal, and ethylene-vinyl alcohol copolymer; polyol polymers such as acrylic polyols, polyester polyols, and polyether polyols; hydroxyl group-containing acrylic polymers such as poly(2-hydroxyethyl methacrylate); cellulose polymers such as cellulose; and the like.

Among these, polyvinyl alcohol polymers are preferable, and polyvinyl alcohol is more preferable, from the viewpoint of more effectively preventing a deterioration in transparency of the formed article, for example. Polyvinyl alcohol may be a saponification product obtained by partially or completely saponifying polyvinyl acetate. The degree of saponification of polyvinyl alcohol is preferably 80% or more.

Polyvinyl butyral and polyvinyl acetal are obtained by acetalization or ketalization of polyvinyl alcohol. It is preferable that polyvinyl butyral and polyvinyl acetal be a reaction product that has a hydroxyl group content within the above range.

The number average molecular weight of the hydroxyl group-containing polymer is preferably 200 to 1,000,000, more preferably 300 to 800,000, and still more preferably 1000 to 20,000.

The primer layer that includes the hydroxyl group-containing polymer may be formed by dissolving or dispersing the hydroxyl group-containing polymer in an appropriate solvent to prepare a primer layer-forming solution, applying the primer layer-forming solution to the base layer, drying the resulting film, and optionally heating the dried film. A commercially available product (e.g., "Gohsenol GL-03" manufactured by Nippon Synthetic Chemical Industry Co., Ltd.) may be used directly as the primer layer-forming solution.

The primer layer-forming solution may be applied to the base layer by a wet coating method. Examples of the wet coating method include dipping, roll coating, gravure coating, knife coating, air knife coating, roll knife coating, die coating, screen printing, spray coating, a gravure offset method, and the like.

The film formed by applying the primer layer-forming solution may be dried by hot-air drying, heat roll drying, infrared irradiation, or the like.

The thickness of the primer layer is normally 1 to 1000 nm, and preferably 10 to 100 nm.

Gas Barrier Layer

The formed article according to one embodiment of the invention includes the gas barrier layer that is provided on the primer layer formed on the base layer.

The gas barrier layer meets the following requirements (a) to (c).

(a) The gas barrier layer is formed of a material that includes at least an oxygen atom and a silicon atom.

(b) The surface layer part of the gas barrier layer has an oxygen atom content rate of 60 to 75% (preferably 60 to 72%, and more preferably 63 to 70%), a nitrogen atom content rate of 0 to 10% (preferably 0.1 to 8%, and more preferably 0.1 to 6%), and a silicon atom content rate of 25 to 35% (preferably 27 to 35%, and more preferably 29 to 32%), based on the total content rate of oxygen atoms, nitrogen atoms, and silicon atoms.

(c) The surface layer part of the gas barrier layer has a film density of 2.4 to 4.0 g/cm$^3$.

The term "surface layer part" used herein in connection with the gas barrier layer refers to the surface of the gas barrier layer and an area of the gas barrier layer up to a depth of 5 nm from the surface of the gas barrier layer. The term "surface" used herein in connection with the gas barrier layer is intended to include the interface with another layer. More specifically, the term "surface" used herein in connection with the gas barrier layer refers to the side of the gas barrier layer opposite to the primer layer.

The oxygen atom content rate, the nitrogen atom content rate, and the silicon atom content rate in the surface layer part are measured by the method described in connection with the examples.

The film density may be calculated using X-ray reflectometry (XRR).

X-rays incident on a thin film formed on a substrate at a very low angle are totally reflected. When the incident angle of the X-rays is equal to or higher than the total reflection critical angle, the X-rays enter the thin film, and are divided into transmitted waves and reflected waves at the surface/interface of the thin film, and the reflected waves undergo interference. The film density can be determined by analyzing the total reflection critical angle. The thickness of the thin film may also be determined by performing measurement while changing the incident angle, and analyzing an interference signal of reflected waves due to a change in optical path difference.

The film density may be measured by the following method.

The refractive index n of a substance when applying X-rays, and the real part δ of the refractive index n normally satisfy the following expressions (1) and (2).

[Expression 1]

$$n = 1 - \delta - i\beta \quad (1)$$

[Expression 2]

$$\delta = \left(\frac{r_e \lambda^2}{2\pi}\right) N_0 \rho \sum_i x_i(Z_i + f_i') \bigg/ \sum_i x_i M_i \quad (2)$$

where, $r_e$ is the electron classical radius (2.818×10$^{-15}$ m), $N_0$ is Avogadro's number, λ is the wavelength of X-rays, ρ is the density (g/cm³), Zi, Mi, and xi respectively are the atomic number, the atomic weight, and the atomic number ratio (molar ratio) of the ith atom, and fi' is the atomic scattering factor (abnormal dispersion term) of the atoms of the ith atom. The total reflection critical angle θc is given by the following expression (3) when β that relates to absorption is disregarded.

[Expression 3]

$$\theta c = \sqrt{2\delta} \quad (3)$$

Therefore, the density ρ is calculated by the following expression (4) based on the relationship between the expressions (2) and (3).

[Expression 4]

$$\rho = \frac{\theta_c^2 \sum_i x_i M_i}{\left(\frac{r_e \lambda^2}{\pi}\right) N_0 \sum_i x_i (Z_i + f_i')} \quad (4)$$

The θc can be calculated from the X-ray reflectivity. The $r_e$, $N_0$, and λ are constants, and the Zi, Mi, and fi' respectively are inherent to the constituent atom. A value obtained by XPS measurement is used as the atomic number ratio xi (molar ratio).

The film density of the surface layer part of the gas barrier layer is measured by the method described in connection with the examples, and is determined using the expression (4).

The thickness of the gas barrier layer is not particularly limited, but is normally 20 nm to 100 μm, preferably 30 nm to 500 nm, and more preferably 40 nm to 200 nm.

According to the embodiments of the invention, a formed article that exhibits a sufficient gas barrier capability can be obtained even if the gas barrier layer has a thickness at a nanometer level.

The gas barrier layer may be a layer (hereinafter may be referred to as "ion-implanted layer") obtained by implanting ions into a polysilazane compound-containing layer (hereinafter may be referred to as "polysilazane layer").

It is preferable that the ion-implanted layer meet the above requirements (a) to (c).

The polysilazane compound used in connection with the invention is a polymer that includes a repeating unit that includes an —Si—N— bond in its molecule. Specific examples of the polysilazane compound include a compound that includes a repeating unit represented by the following formula (1).

[Chemical Formula 1]

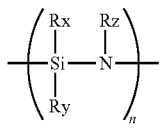

(1)

Note that n in the formula (1) is an arbitrary natural number.

Rx, Ry, and Rz independently represent a hydrogen atom or a non-hydrolyzable group such as a substituted or unsubstituted alkyl group, a substituted or unsubstituted cycloalkyl group, a substituted or unsubstituted alkenyl group, a substituted or unsubstituted aryl group, or an alkylsilyl group.

Examples of the unsubstituted alkyl group include alkyl groups having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the unsubstituted cycloalkyl group include cycloalkyl groups having 3 to 10 carbon atoms (e.g., cyclobutyl group, cyclopentyl group, cyclohexyl group, and cycloheptyl group).

Examples of the unsubstituted alkenyl group include alkenyl groups having 2 to 10 carbon atoms (e.g., vinyl group, 1-propenyl group, 2-propenyl group, 1-butenyl group, 2-butenyl group, and 3-butenyl group).

Examples of a substituent that may substitute the alkyl group, the cycloalkyl group, and the alkenyl group include halogen atoms such as a fluorine atom, a chlorine atom, a bromine atom, and an iodine atom; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the unsubstituted aryl group include aryl groups having 6 to 10 carbon atoms (e.g., phenyl group, 1-naphthyl group, and 2-naphthyl group).

Examples of a substituent that may substitute the aryl group include halogen atoms such as a fluorine atom, a chlorine atom, a bromine atom, and an iodine atom; alkyl groups having 1 to 6 carbon atoms, such as a methyl group and an ethyl group; alkoxy groups having 1 to 6 carbon atoms, such as a methoxy group and an ethoxy group; a nitro group; a cyano group; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the alkylsilyl group include a trimethylsilyl group, a triethylsilyl group, a triisopropylsilyl group, a tri-t-butylsilyl group, a t-butyldimethylsilyl group, a methyldiethylsilyl group, a dimethylsilyl group, a diethylsilyl group, a methylsilyl group, an ethylsilyl group, and the like.

Among these, a hydrogen atom, an alkyl group having 1 to 6 carbon atoms, or a phenyl group is preferable as Rx, Ry, and Rz. A hydrogen atom is particularly preferable as Rx, Ry, and Rz.

The polysilazane compound that includes the repeating unit represented by the formula (1) may be an inorganic polysilazane in which Rx, Ry, and Rz represent a hydrogen atom, or an organic polysilazane in which at least one of Rx, Ry, and Rz does not represent a hydrogen atom.

Examples of the inorganic polysilazane include a perhydropolysilazane that has a linear structure including a repeating unit represented by the following formula, has a molecular weight of 690 to 2000, and includes 3 to 10 SiH₃ groups in one molecule (see JP-B-63-16325),

[Chemical Formula 2]

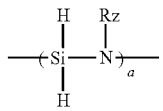

wherein a is an arbitrary natural number, a perhydropolysilazane that has a linear structure and a branched structure, and includes a repeating unit represented by the following formula (A),

[Chemical Formula 3]

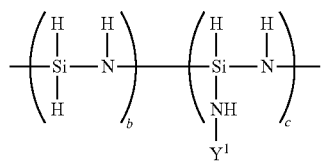

(A)

wherein b and c are arbitrary natural numbers, and $Y^1$ represents a hydrogen atom or a group represented by the following formula (B),

[Chemical Formula 4]

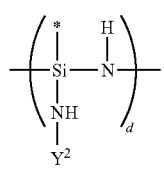

(B)

wherein d is an arbitrary natural number, * indicates the bonding position, and $Y^2$ represents a hydrogen atom or a group represented by the formula (B), a perhydropolysilazane that has a linear structure, a branched structure, and a cyclic structure in its molecule, and includes the perhydropolysilazane structure represented by the following formula (C),

[Chemical Formula 5]

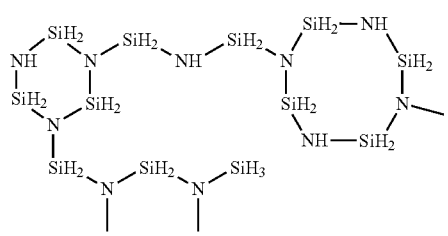

(C)

and the like.

Examples of the organic polysilazane include (i) a polysilazane that includes a repeating unit represented by —(Rx'SiHNH)— (wherein Rx' represents a substituted or unsubstituted alkyl group, a substituted or unsubstituted cycloalkyl group, a substituted or unsubstituted alkenyl group, a substituted or unsubstituted aryl group, or an alkylsilyl group (hereinafter the same)), and has a cyclic structure having a degree of polymerization of 3 to 5, (ii) a polysilazane that includes a repeating unit represented by —(Rx'SiHNRz')— (wherein Rz' represents a substituted or unsubstituted alkyl group, a substituted or unsubstituted cycloalkyl group, a substituted or unsubstituted alkenyl group, a substituted or unsubstituted aryl group, or an alkylsilyl group), and has a cyclic structure having a degree of polymerization of 3 to 5, (iii) a polysilazane that includes a repeating unit represented by —(Rx'Ry'SiNH)— (wherein Ry' represents a substituted or unsubstituted alkyl group, a substituted or unsubstituted cycloalkyl group, a substituted or unsubstituted alkenyl group, a substituted or unsubstituted aryl group, or an alkylsilyl group), and has a cyclic structure having a degree of polymerization of 3 to 5, (iv) a polyorgano(hydro)silazane that includes a structure represented by the following formula in its molecule,

[Chemical Formula 6]

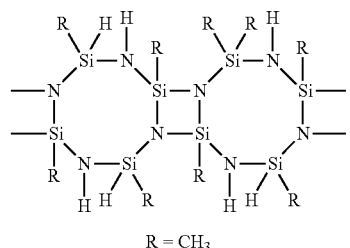

$R = CH_3$ (v) a polysilazane that includes a repeating unit represented by the following formula,

[Chemical Formula 7]

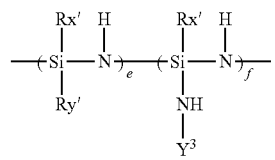

wherein Rx' and Ry' are the same as defined above, e and f are arbitrary natural numbers, and $Y^3$ represents a hydrogen atom or a group represented by the following formula (E),

[Chemical Formula 8]

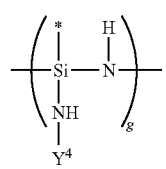

(E)

wherein g is an arbitrary natural number, * indicates the bonding position, and $Y^4$ represents a hydrogen atom or a group represented by the formula (E), and the like.

The above organic polysilazanes may be produced by a known method. For example, the above organic polysilazanes may be produced by reacting ammonia or a primary amine with a reaction product of a substituted or unsubstituted halogenosilane compound represented by the following formula (2) and a secondary amine.

[Chemical Formula 9]

(2)

wherein m is 2 or 3, X represents a halogen atom, and R' represents a substituent that substitutes Rx, Ry, Rz, Rx', Ry', or Rz'.

The secondary amine, ammonia, and the primary amine may be appropriately selected depending on the structure of the target polysilazane compound.

A modified polysilazane may also be used as the polysilazane compound. Examples of the modified polysilazane include a polymetallosilazane that includes a metal atom (which may be crosslinked), a polysiloxazane that includes a repeating unit represented by $(SiH_2)_g(NH)_h$) and a repeating unit represented by $(SiH_2)_iO$ (wherein g, h, and i are 1, 2, or 3) (see JP-A62-195024), a polyborosilazane produced by reacting a polysilazane with a boron compound (see JP-A-2-84437), a polymetallosilazane produced by reacting a polysilazane with a metal alkoxide (see JP-A-63-81122, for example), an inorganic silazane polymer and a modified polysilazane (see JP-A-1-138108, for example), a copolymer silazane produced by introducing an organic component into a polysilazane (see JP-A-2-175726, for example), a low-temperature ceramic polysilazane obtained by adding a ceramic-forming catalyst compound to a polysilazane (see JP-A-5-238827, for example),
a silicon alkoxide-addition polysilazane (see JP-A-5-238827), a glycidol-addition polysilazane (see JP-A-6-122852), an acetylacetonato complex-addition polysilazane (see JP-A-6-306329), a metal carboxylate-addition polysilazane (see JP-A-6-299118, for example),
a polysilazane composition produced by adding an amine and/or an acid to the above polysilazane or modified polysilazane (see JP-A-9-31333), a modified polysilazane produced by adding an alcohol (e.g., methanol) or hexamethyldisilazane to the terminal nitrogen (N) atom of perhydropolysilazane (see JP-A-5-345826 and JP-A-4-63833), and the like.

The polysilazane compound used in connection with the invention is preferably an inorganic polysilazane in which Rx, Ry, and Rz represent hydrogen atoms, or an organic polysilazane in which at least one of Rx, Ry, and Rz does not represent a hydrogen atom, and more preferably an inorganic polysilazane from the viewpoint of availability and a capability to form an implanted layer that exhibits an excellent gas barrier capability.

The number average molecular weight of the polysilazane compound is not particularly limited, but is preferably 100 to 50,000.

A product commercially available as a glass coating material or the like may be used directly as the polysilazane compound.

The polysilazane layer may include an additional component other than the polysilazane compound as long as the object of the invention is not impaired. Examples of the additional component include a curing agent, an additional polymer, an aging preventive, a light stabilizer, a flame retardant, and the like.

The content of the polysilazane compound in the polysilazane layer is preferably 50 wt % or more, and more preferably 70 wt % or more, so that an ion-implanted layer that exhibits an excellent gas barrier capability can be formed.

The polysilazane layer may be formed by an arbitrary method. For example, the polysilazane layer may be formed by applying a layer-forming solution that includes at least one polysilazane compound, an optional additional component, a solvent, and the like to the primer layer, and appropriately drying the resulting film.

A spin coater, a knife coater, a gravure coater, or the like may be used to apply the layer-forming solution.

It is preferable to heat the resulting film in order to dry the film, and improve the gas barrier capability of the resulting formed article. In this case, the film is heated at 80 to 150° C. for several tens of seconds to several tens of minutes.

The polysilazane layer may also be formed by causing gas of a plasma-polymerizable silazane compound (e.g., dimethyldisilazane, tetramethyldisilazane, or hexamethyldisilazane) to come in contact with a plastic formed article, and subjecting the resulting product to plasma polymerization (see JP-A-9-143289).

The thickness of the polysilazane layer is not particularly limited, but is normally 20 nm to 100 µm, preferably 30 nm to 500 nm, and more preferably 40 nm to 200 nm.

According to the embodiments of the invention, a formed article that exhibits a sufficient gas barrier capability can be obtained even if the polysilazane layer has a thickness at a nanometer level.

It is considered that as illustrated in FIG. 1(a), when a polysilazane layer 30 is formed on a primer layer 20, a layer 40 of a reaction product of the polysilazane compound and the hydroxyl groups of the hydroxyl group-containing polymer is formed at the interface between the polysilazane layer 30 and the primer layer 20. As illustrated in FIG. 1(b), the layer 40 prevents a situation in which ions pass through the polysilazane layer 30, and are implanted into the surface of the base layer 10 when implanting ions into the polysilazane layer 30 to obtain a formed article 100a in which an ion-implanted layer (gas barrier layer) 50a having an ion implantation target area 60 is formed (see FIG. 1(c)).

Specifically, it is considered that the polysilazane compound included in the polysilazane layer 30 reacts with the hydroxyl groups of the hydroxyl group-containing polymer included in the primer layer 20 at the interface between the polysilazane layer 30 and the primer layer 20, so that a layer of a compound (e.g., $SiO_2$) that includes an —Si—O— bond in its molecule is formed as the layer 40 of the reaction product. A situation in which ions are implanted into the base layer 10, whereby the base layer 10 is carbonized is prevented by the layer of the compound that includes an —Si—O— bond in its molecule when implanting ions into the polysilazane layer 30. This makes it possible to prevent coloration of the base layer 10, and suppress a deterioration in transparency of the formed article.

Note that the presence of the layer 40 of the reaction product may be confirmed by measuring the oxygen atom content rate, the nitrogen atom content rate, and the silicon atom content rate at the interface between the polysilazane layer 30 and the primer layer 20 using the method described in connection with the examples.

The ion-implanted layer included in the formed article according to one embodiment of the invention is not particularly limited as long as the ion-implanted layer is a layer which includes at least one polysilazane compound and into which ions are implanted.

The dose of ions implanted into the polysilazane layer may be appropriately determined depending on the intended use of the resulting formed article (e.g., desired gas barrier capability and transparency), and the like.

Examples of the ions implanted into the polysilazane layer include ions of a rare gas (e.g., argon, helium, neon, krypton, and xenon), a fluorocarbon, hydrogen, nitrogen, oxygen, carbon dioxide, chlorine, fluorine, sulfur, and the like; ions of a metal (e.g., gold, silver, copper, platinum, nickel, palladium, chromium, titanium, molybdenum, niobium, tantalum, tungsten, and aluminum); and the like.

Among these, ions of at least one gas (element) selected from the group consisting of hydrogen, nitrogen, oxygen, argon, helium, neon, xenon, and krypton is preferable due to ease of implantation and a capability to form an ion-implanted layer that exhibits an excellent gas barrier capability and excellent transparency.

The dose of ions implanted into the polysilazane layer may be appropriately determined depending on the intended use of the resulting formed article (e.g., desired gas barrier capability and transparency), and the like.

The ion implantation method is not particularly limited. For example, a method that forms a polysilazane layer, and implants ions into the polysilazane layer may be used.

The ions may be implanted by applying ions (ion beams) accelerated by an electric field, implanting ions present in plasma (plasma ion implantation method), or the like. It is preferable to use the plasma ion implantation method since a gas barrier formed article can be easily obtained.

The plasma ion implantation method may be implemented by generating plasma in an atmosphere containing a plasma-generating gas (e.g., rare gas), and implanting ions (cations) present in the plasma into the surface area of the polysilazane layer by applying a negative high-voltage pulse to the polysilazane layer, for example.

The thickness of the ion implantation target area may be controlled by adjusting the implantation conditions (e.g., type of ions, applied voltage, and implantation time), and may be determined depending on the thickness of the polysilazane layer, the intended use of the formed article, and the like. The thickness of the ion implantation target area is normally 10 to 1000 nm.

Whether or not the ions have been implanted may be determined by performing elemental analysis on the surface area up to a depth of about 10 nm using X-ray photoelectron spectroscopy (XPS).

Formed Article

Figure 2:
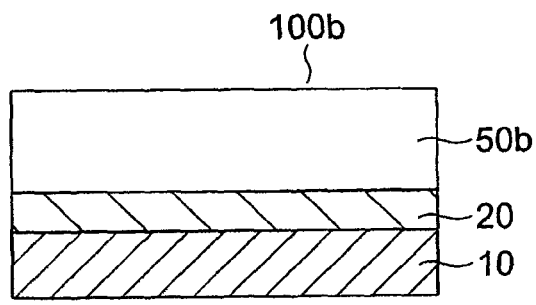
FIG. 2 is a cross-sectional view illustrating the layer configuration of a formed article.

FIG. 2 is a cross-sectional view illustrating the layer configuration of a formed article 100b according to one embodiment of the invention. In FIG. 2, reference sign 10 indicates the base layer, reference sign 20 indicates the primer layer, and reference sign 50b indicates the gas barrier layer. Since the formed article 100b according to one embodiment of the invention has a configuration in which the primer layer 20 that includes the hydroxyl group-containing polymer is formed between the base layer 10 and the gas barrier layer 50b, the base layer 10 and the gas barrier layer 50b exhibit excellent adhesion, and the formed article 100b exhibits an excellent gas barrier capability and excellent transparency.

The layer configuration of the formed article according to one embodiment of the invention is not limited to that illustrated in FIG. 2. The formed article may further include an additional layer. The additional layer may be a single layer, or may include a plurality of identical or different layers. Examples of the additional layer include an inorganic compound layer, an impact-absorbing layer, a conductor layer, and the like.

The inorganic compound layer is formed of (includes) one or more inorganic compounds. The gas barrier capability of the formed article can be further improved by providing the inorganic compound layer.

Examples of the inorganic compounds include inorganic compounds that can be deposited under vacuum, and exhibit a gas barrier capability, such as inorganic oxides, inorganic nitrides, inorganic carbides, inorganic sulfides, and composites thereof (e.g., inorganic oxynitride, inorganic oxycarbide, inorganic carbonitride, and inorganic oxycarbonitride).

The thickness of the inorganic compound layer is normally 10 to 1000 nm, preferably 20 to 500 nm, and more preferably 20 to 100 nm.

The impact-absorbing layer protects the gas barrier layer when an impact is applied to the gas barrier layer. A material for forming the impact-absorbing layer is not particularly limited. Examples of the material for forming the impact-absorbing layer include acrylic resins, urethane resins, silicone resins, olefin resins, rubber materials, and the like.

A product commercially available as a pressure-sensitive adhesive, a coating material, a sealing material, or the like may also be used as the material for forming the impact-absorbing layer. It is preferable to use a pressure-sensitive adhesive (e.g., acrylic pressure-sensitive adhesive, silicone pressure-sensitive adhesive, or rubber pressure-sensitive adhesive).

The impact-absorbing layer may be formed by an arbitrary method. For example, the impact-absorbing layer may be formed by applying an impact-absorbing layer-forming solution that includes the material (e.g., pressure-sensitive adhesive) for forming the impact-absorbing layer and an optional additional component (e.g., solvent) to a layer on which the impact-absorbing layer is to be formed, drying the resulting film, and optionally heating the dried film in the same manner as in the case of forming the polysilazane compound-containing layer.

Alternatively, the impact-absorbing layer may be formed on a release base, and transferred to the layer on which the impact-absorbing layer is to be formed.

The thickness of the impact-absorbing layer is normally 1 to 100 μm, and preferably 5 to 50 μm.

The conductor layer provides conductivity to the formed article according to one embodiment of the invention when the formed article is used as an electrode or the like, or when it is desired to provide antistaticity to the formed article. Examples of a material for forming the conductor layer include metals, alloys, metal oxides, electrically conductive compounds, mixtures thereof, and the like. Specific examples of the material for forming the conductor layer include antimony-doped tin oxide (ATO); fluorine-doped tin oxide (FTO); semiconductive metal oxides such as tin oxide, zinc oxide, indium oxide, indium tin oxide (ITO), and indium zinc oxide (IZO); metals such as gold, silver, chromium, and nickel; a mixture of a metal and a conductive metallic oxide; inorganic conductive substances such as copper iodide and copper sulfide; organic conductive materials such as polyaniline, polythiophene, and polypyrrole; and the like.

The conductor layer may be formed by an arbitrary method. For example, the conductor layer may be formed by evaporation (deposition), sputtering, ion plating, thermal CVD, plasma CVD, or the like.

The thickness of the conductor layer may be appropriately selected depending on the application and the like. The thickness of the conductor layer is normally 10 nm to 50 μm, and preferably 20 nm to 20 μm.

When the formed article according to one embodiment of the invention includes the additional layer, the additional layer may be situated at an arbitrary position as long as the primer layer and the gas barrier layer are adjacent to each other.

The formed article according to one embodiment of the invention is preferably in the shape of a film or a sheet. When the formed article according to one embodiment of the invention is in the shape of a film or a sheet, the thickness of the formed article may be appropriately determined depending on the application of the target electronic device.

The formed article according to one embodiment of the invention exhibits an excellent gas barrier capability and excellent transparency.

The formed article according to one embodiment of the invention exhibits an excellent gas barrier capability since the formed article has a low gas (e.g., water vapor) transmission rate. For example, the water vapor transmission rate of the formed article at a temperature of 40° C. and a relative humidity of 90% is preferably less than 0.10 g/m$^2$/day, and more preferably 0.05 g/m$^2$/day or less. Note that the gas (e.g., water vapor) transmission rate of the formed article may be measured using a known gas transmission rate measurement system.

The formed article according to one embodiment of the invention exhibits excellent transparency since the formed article has high total light transmittance and visible light transmittance.

For example, the total light transmittance of the formed article measured in accordance with JIS K 7361-1 is preferably 90% or more.

The visible light transmittance (wavelength: 550 nm) of the formed article is preferably 90% or more. The total light transmittance and the visible light transmittance of the formed article may be measured using a known measurement system.

2) Method for Producing Formed Article

A method for producing a formed article according to one embodiment of the invention includes forming a polysilazane compound-containing layer (polysilazane layer) on a primer layer that is formed on a surface of a base layer and includes a hydroxyl group-containing polymer, and implanting ions into a surface area of the polysilazane compound-containing layer.

The polysilazane layer may be formed by an arbitrary method on the primer layer that is formed on the surface of the base and includes the hydroxyl group-containing polymer. It is preferable to form the primer layer on the base layer using the above method, and form the polysilazane layer on the resulting primer layer using the above method.

According to one embodiment of the invention, it is preferable to produce the formed article by implanting ions into the surface area of a polysilazane layer of a long formed body while feeding the formed body in a given direction, the formed body having a configuration in which a primer layer that includes a hydroxyl group-containing polymer is formed on a base layer, and the polysilazane layer is formed on the primer layer.

According to this method, ions can be implanted into a long formed body wound around a feed-out roll while feeding the formed body in a given direction, which can then be wound around a wind-up roll, for example. Therefore, an ion-implanted formed article can be continuously produced.

The long formed body may include an additional layer as long as the polysilazane layer is formed in the surface area, and the primer layer and the polysilazane layer are adjacent to each other. Examples of the additional layer include those mentioned above.

The thickness of the formed body is preferably 1 to 500 μm, and more preferably 5 to 300 μm, from the viewpoint of winding/unwinding operability and feeding operability.

The ions may be implanted into the polysilazane layer by an arbitrary method. It is preferable to form an ion-implanted layer in the surface area of the polysilazane layer using the plasma ion implantation method.

The plasma ion implantation method includes applying a negative high-voltage pulse to the formed body that includes the polysilazane layer in its surface area and is exposed to plasma to implant ions present in the plasma into the surface area of the polysilazane layer.

It is preferable to use (A) a plasma ion implantation method that implants ions present in plasma generated by utilizing an external electric field into the surface area of the polysilazane layer, or (B) a plasma ion implantation method that implants ions present in plasma generated due to an electric field produced by applying a negative high-voltage pulse to the polysilazane layer into the surface area of the polysilazane layer.

When using the method (A), it is preferable to set the ion implantation pressure (plasma ion implantation pressure) to 0.01 to 1 Pa. When the plasma ion implantation pressure is within the above range, a uniform ion-implanted layer can be formed conveniently and efficiently. This makes it possible to efficiently form an ion-implanted layer that exhibits transparency and a gas barrier capability.

The method (B) does not require increasing the degree of decompression, allows a simple operation, and significantly reduces the processing time. Moreover, the entire polysilazane layer can be uniformly treated, and ions present in the plasma can be continuously implanted into the surface area of the polysilazane layer with high energy when applying a negative high-voltage pulse. The method (B) also has an advantage in that an excellent ion-implanted layer can be uniformly formed in the surface area of the polysilazane layer by merely applying a negative high-voltage pulse to the polysilazane layer without requiring a special means such as a high-frequency power supply (e.g., radio frequency (RF) power supply or microwave power supply).

When using the method (A) or (B), the pulse width when applying a negative high-voltage pulse (i.e., during ion implantation) is preferably 1 to 15 μs. When the pulse width is within the above range, a transparent and uniform ion-implanted layer can be formed more conveniently and efficiently.

The voltage applied when generating plasma is preferably −1 to −50 kV, more preferably −1 to −30 kV, and particularly preferably −5 to −20 kV. If the applied voltage is higher than −1 kV, the dose may be insufficient, and the desired performance may not be obtained. If the applied voltage is lower than −50 kV, the formed article may be electrically charged during ion implantation, or the formed article may be colored, for example.

The ion species used for plasma ion implantation is the same as described above. It is preferable to use ions of hydrogen, nitrogen, oxygen, argon, helium, neon, xenon, or krypton due to ease of ion implantation and a capability to form a formed article that exhibits excellent transparency and an excellent gas barrier capability. It is more preferable to use ions of nitrogen, oxygen, argon, or helium.

A plasma ion implantation apparatus is used when implanting ions present in plasma into the surface area of the polysilazane layer.

Specific examples of the plasma ion implantation apparatus include (α) a system that causes the polysilazane layer (hereinafter may be referred to as "ion implantation target layer") to be evenly enclosed by plasma by superimposing high-frequency electric power on a feed-through that applies a negative high-voltage pulse to the ion implantation target layer so that ions present in the plasma are attracted to and collide with the target, and thereby implanted and deposited therein (JP-A-2001-26887), (β) a system that includes an antenna in a chamber, wherein high-frequency electric power is applied to generate plasma, and positive and negative pulses are alternately applied to the ion implantation target layer after the plasma has reached an area around the ion implantation target layer, so that ions present in the plasma are attracted to and implanted into the target while heating the ion implantation target layer, causing electrons present in the plasma to be attracted to and collide with the target due to the positive pulse, and applying the negative pulse while controlling the temperature by controlling the pulse factor (JP-A-2001-156013), (γ) a plasma ion implantation apparatus that generates plasma using an external electric field utilizing a high-frequency electric power supply such as a microwave power supply, and causes ions present in the plasma to be attracted to and implanted into the target by applying a high-voltage pulse, (δ) a plasma ion implantation apparatus that implants ions present in plasma generated due to an electric field produced by applying a high-voltage pulse without using an external electric field, and the like.

It is preferable to use the plasma ion implantation apparatus (γ) or (δ) since the plasma ion implantation apparatus (γ) or (δ) allows a simple operation, significantly reduces the processing time, and can be continuously used.

A method that utilizes the plasma ion implantation apparatus (γ) or (δ) is described in WO2010/021326.

Since the plasma ion implantation apparatus (γ) or (6) is configured so that the high-voltage pulsed power supply also serves as a plasma generation means, a special means such as a high-frequency electric power supply (e.g., RF power supply or microwave power supply) is unnecessary. An ion-implanted layer can be continuously formed by implanting ions present in the plasma into the surface area of the polysilazane layer by merely applying a negative high-voltage pulse. Therefore, a formed article in which an ion-implanted layer is formed can be mass-produced.

3) Electronic Device Member and Electronic Device

An electronic device member according to one embodiment of the invention includes the formed article according to one embodiment of the invention. Therefore, since the electronic device member according to one embodiment of the invention exhibits an excellent gas barrier capability, a deterioration in an element (member or device) due to gas (e.g., water vapor) can be prevented. Since the electronic device member exhibits high light transmittance, the electronic device member may suitably be used for electronic paper, touch panels, displays, solar cells, and the like.

An electronic device according to one embodiment of the invention includes the electronic device member according to one embodiment of the invention. Specific examples of the electronic device include a touch panel, a liquid crystal display, an organic EL display, an inorganic EL display, electronic paper, a solar cell, and the like.

Since the electronic device according to one embodiment of the invention includes the electronic device member that includes the formed article according to one embodiment of the invention, the electronic device exhibits an excellent gas barrier capability and excellent transparency.

EXAMPLES

The invention is further described below by way of examples. Note that the invention is not limited to the following examples.

The following X-ray photoelectron spectrometer, X-ray reflectometry film density measurement method, plasma ion implantation apparatus, water vapor transmission rate measurement system, water vapor transmission rate measurement conditions, oxygen transmission rate measurement system, oxygen transmission rate measurement conditions, total light transmittance measurement system, and visible light transmittance measurement system were used. Note that a system that implants ions by utilizing an external electric field was used as the plasma ion implantation apparatus.

X-Ray Photoelectron Spectrometer

The oxygen atom content rate, the nitrogen atom content rate, and the silicon atom content rate in the surface layer part of the gas barrier layer were measured under the following measurement conditions.
Measurement system: "PHI Quantera SXM" manufactured by ULVAC-PHI, Incorporated
X-ray source: AlKα
X-ray beam diameter: 100 μm
Electric power: 25 W
Voltage: 15 kV
Take-off angle: 45°
Degree of vacuum: $5.0 \times 10^{-8}$ Pa
Sputtering Conditions
Sputtering gas: argon
Applied voltage: −4 kV X-Ray Photoelectron Spectroscopy Film Density Measurement Method The X-ray reflectance was measured under the following measurement conditions to determine the total reflection critical angle θc, and the film density of the surface area of the gas barrier layer was calculated from the total reflection critical angle θc.

The following measurement system and measurement conditions were used.
Measurement system: X-ray diffractometer "SmartLab" (manufactured by Rigaku Corporation)
Measurement Conditions
X-ray source: Cu—Kα1 (wavelength: 1.54059 Å)
Optical system: parallel beam optical system
Incident-side slit system: Ge(220)2 crystal, height-limiting slit: 5 mm, incident slit: 0.05 mm
Receiving-side slit system: receiving slit: 0.10 mm, soller slit: 5°
Detector: scintillation counter
Tube voltage-tube current: 45 kV-200 mA
Scan axis: 2θ/θ
Scan mode: continuous scan
Scan range: 0.1 to 3.0 deg.
Scan speed: 1 deg./min
Sampling interval: 0.002°/step The oxygen atom content rate, the nitrogen atom content rate, and the silicon atom content rate in the surface layer part of the gas barrier layer measured by X-ray photoelectron spectroscopy were used for the atomic number ratio (xi).

Plasma Ion Implantation Apparatus
RF power supply: "RF56000" manufactured by JEOL Ltd.
High-voltage pulse power supply: "PV-3-HSHV-0835" manufactured by Kurita Seisakusho Co., Ltd.

Measurement of Water Vapor Transmission Rate
Water vapor transmission rate measurement system: "PERMATRAN-W3/33" manufactured by Mocon
Measurement conditions: relative humidity: 90%, temperature: 40° C.

Measurement of Oxygen Transmission Rate
Oxygen transmission rate measurement system: "OX-TRAN2/21" manufactured by Mocon
Measurement conditions: relative humidity: 60%, temperature: 23° C.

Measurement of Total Light Transmittance
The total light transmittance was measured in accordance with JIS K 7361-1 using a total light transmittance measurement system ("NDH2000" manufactured by Nippon Denshoku Industries Co., Ltd.).

Measurement of Visible Light Transmittance
The visible light transmittance was measured using a ultra violet visible near infra red spectrophotometer ("UV-3600" manufactured by Shimadzu Corporation). Measurement conditions: wavelength: 550 nm The primer layer was formed using the following materials.
Resin A: Gohsenol GL-03 manufactured by Nippon Synthetic Chemical Industry Co., Ltd. (main component: polyvinyl alcohol, content of hydroxyl group-containing repeating units: 86.5 to 89.0 mol %)
Resin B: Gohsenol LW-300 manufactured by Nippon Synthetic Chemical Industry Co., Ltd. (main component: polyvinyl alcohol, content of hydroxyl group-containing repeating units: 53.0 to 60.0 mol %)

Resin C: Eval L-104B manufactured by Kuraray Co., Ltd. (ethylene-vinyl alcohol (27/73 mol %) copolymer, content of hydroxyl group-containing repeating units: 73 mol %)

Resin D: Solution (solid content: 8 wt %) prepared by dissolving a resin containing a polyurethane acrylate UV-curable compound (i.e., a compound that does not include a hydroxyl group-containing repeating unit) as the main component ("Vylon UR1350" manufactured by Toyobo Co., Ltd.) in methyl ethyl ketone Resin E: S-LEC KS-10 manufactured by Sekisui Chemical Co., Ltd. (polyvinyl acetal resin, content of hydroxyl group-containing repeating units: 25 mol %)

The following product was used as the polysilazane layer-forming composition. Aquamika NL110-20 manufactured by Clariant Japan K.K. (coating agent containing perhydropolysilazane as the main component)

Example 1

An aqueous solution of the resin A (primer layer-forming solution) was spin-coated onto a polyethylene terephthalate film (PET film) ("PET25T-61M" manufactured by Toray Industries Inc., thickness: 25 μm) (base layer) so that the thickness after drying was 45 nm, and heated at 120° C. for 2 minutes to form a primer layer.

A coating liquid containing the resin E was spin-coated onto the primer layer so that the thickness after drying was 45 nm, and heated at 120° C. for 2 minutes to form a polysilazane layer (thickness: 45 nm) on the primer layer that was formed on the PET film. Argon (Ar) ions were implanted into the surface of the polysilazane layer using the plasma ion implantation apparatus to form a gas barrier layer to obtain a formed article 1.

The plasma ion implantation conditions are shown below.
Gas flow rate: 100 sccm
Duty ratio: 0.5%
Repetition frequency: 1000 Hz
Applied voltage: −10 kV
RF power supply: frequency: 13.56 MHz, applied electric power: 1000 W
Chamber internal pressure: 0.2 Pa
Pulse width: 5 μs
Processing time (ion implantation time): 5 min
Line (feed) speed: 0.2 m/min

Example 2

A formed article 2 was obtained in the same manner as in Example 1, except that the resin B was used instead of the resin A.

Example 3

A formed article 3 was obtained in the same manner as in Example 1, except that a solution prepared by dissolving the resin C in methyl sulfoxide was used instead of the aqueous solution of the resin A.

Example 4

A formed article 4 was obtained in the same manner as in Example 1, except that a solution prepared by dissolving the resin E in a toluene/ethyl acetate mixture was used instead of the aqueous solution of the resin A.

Comparative Example 1

A formed article was obtained in the same manner as in Example 1, except that ion implantation was not performed. Specifically, a primer layer and a polysilazane layer were formed on the PET film to obtain a formed article 1r.

Comparative Example 2

A formed article was obtained in the same manner as in Example 1, except that the polysilazane layer was not formed on the primer layer. Specifically, argon ions were implanted into the surface of the primer layer formed on the PET film to obtain a formed article 2r.

Comparative Example 3

A formed article was obtained in the same manner as in Example 1, except that the primer layer was not formed on the PET film. Specifically, a polysilazane layer was formed on the PET film, and argon ions were implanted into the surface of the polysilazane layer to form a gas barrier layer to obtain a formed article 3r.

Comparative Example 4

A formed article 4r was obtained in the same manner as in Example 1, except that a solution prepared by dissolving the resin D in a methyl ethyl ketone/cyclohexane mixture (volume ratio: 1:1) was spin-coated onto the PET film instead of the aqueous solution of the resin A so that the thickness after drying was 45 nm, and heated at 120° C. for 2 minutes, and UV rays were applied to the solution (high-pressure mercury lamp, line speed: 20 m/min, integrated intensity: 100 mJ/cm$^2$, peak intensity 1.466 W, pass count: 2) using a UV-ray irradiation line to form a primer layer.

Comparative Example 5

The PET film was used directly as a formed article 5r.

In Examples 1 to 3 and Comparative Examples 2 to 4, implantation of ions was confirmed by subjecting the surface area up to a depth of about 10 nm to elemental analysis (X-ray photoelectron spectroscopy (XPS)) using the X-ray photoelectron spectrometer.

Table 1 shows the type of the primer layer-forming resin used in each example and comparative example, the thickness of the primer layer, the type of the polysilazane layer-forming composition, the thickness of the polysilazane layer, and the presence or absence of ion implantation.

TABLE 1

| | Primer layer | | Gas barrier layer | | |
|---|---|---|---|---|---|
| | Type | Thickness (nm) | Thickness (nm) | Ion implantation | Formed article |
| Example 1 | A | 45 | 45 | Yes | 1 |
| Example 2 | B | 45 | 45 | Yes | 2 |
| Example 3 | C | 45 | 45 | Yes | 3 |
| Example 4 | E | 45 | 45 | Yes | 4 |
| Comparative Example 1 | A | 45 | 45 | No | 1r |
| Comparative Example 2 | A | 45 | — | Yes | 2r |
| Comparative Example 3 | — | — | 45 | Yes | 3r |
| Comparative Example 4 | D | 45 | 45 | Yes | 4r |

TABLE 1-continued

| | Primer layer | | Gas barrier layer | | |
| --- | --- | --- | --- | --- | --- |
| | Type | Thickness (nm) | Thickness (nm) | Ion implantation | Formed article |
| Comparative Example 5 | — | — | — | No | 5r |

Figure 3:
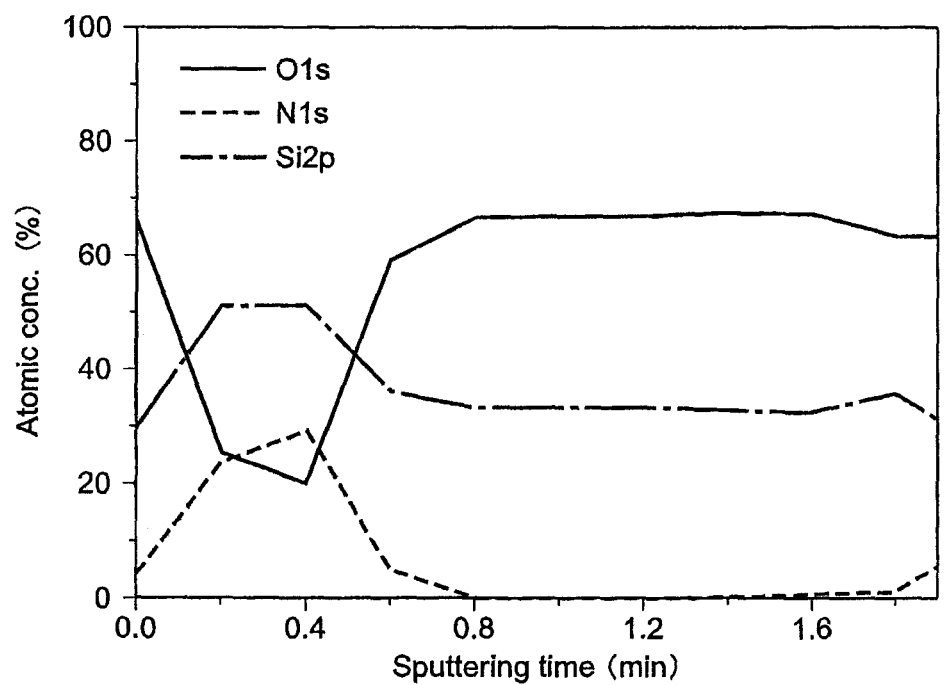
FIG. 3 is a view illustrating the oxygen atom content rate (%), the nitrogen atom content rate (%), and the silicon atom content rate (%) in a surface area (up to a depth of about 50 nm) of the formed article 1 obtained in Example 1.
Figure 4:
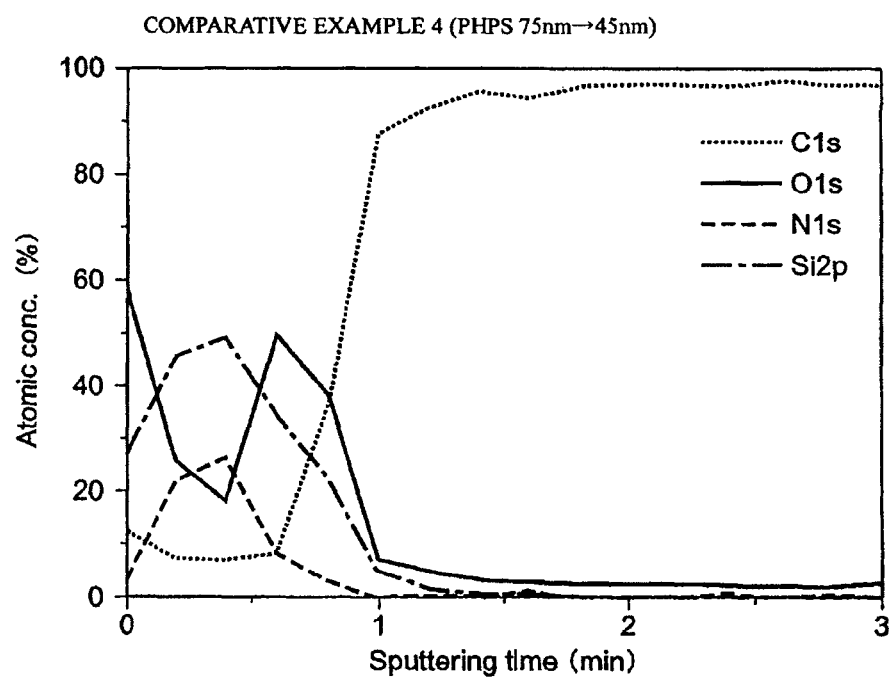
FIG. 4 is a view illustrating the oxygen atom content rate (%), the nitrogen atom content rate (%), and the silicon atom content rate (%) in a surface area (up to a depth of about 50 nm) of the formed article 4r obtained in Comparative Example 4.

FIGS. 3 and 4 show the XPS elemental analysis results for the oxygen atom content rate, the nitrogen atom content rate, and the silicon atom content rate in the surface area (up to a depth of about 50 nm) of the gas barrier layer of the formed article 1 obtained in Example 1 and the formed article 4r obtained in Comparative Example 4. In FIGS. 3 and 4, the vertical axis indicates the oxygen atom content rate (%), the nitrogen atom content rate (%), and the silicon atom content rate (%) based on the total content rate (=100%) of oxygen atoms, nitrogen atoms, and silicon atoms, and the horizontal axis indicates the cumulative sputtering time (min). Since the sputtering conditions were constant, the cumulative sputtering time corresponds to the depth from the surface of the gas barrier layer.

Figure 5:
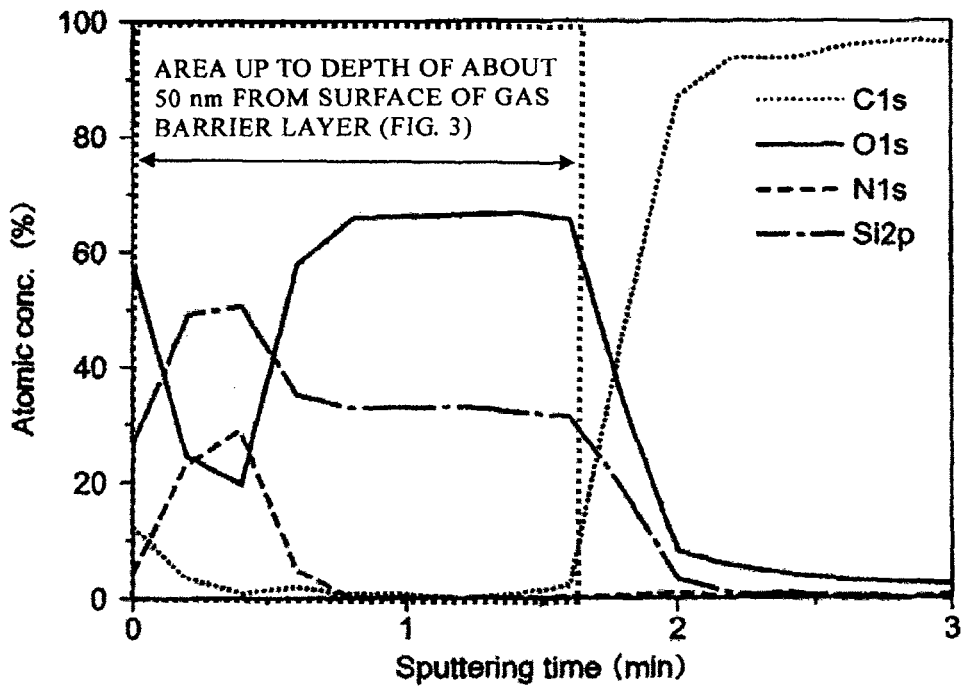
FIG. 5 is a view illustrating the oxygen atom content rate (%), the carbon atom content rate (%), the nitrogen atom content rate (%), and the silicon atom content (%) in the formed article 1 obtained in Example 1.
Figure 6:
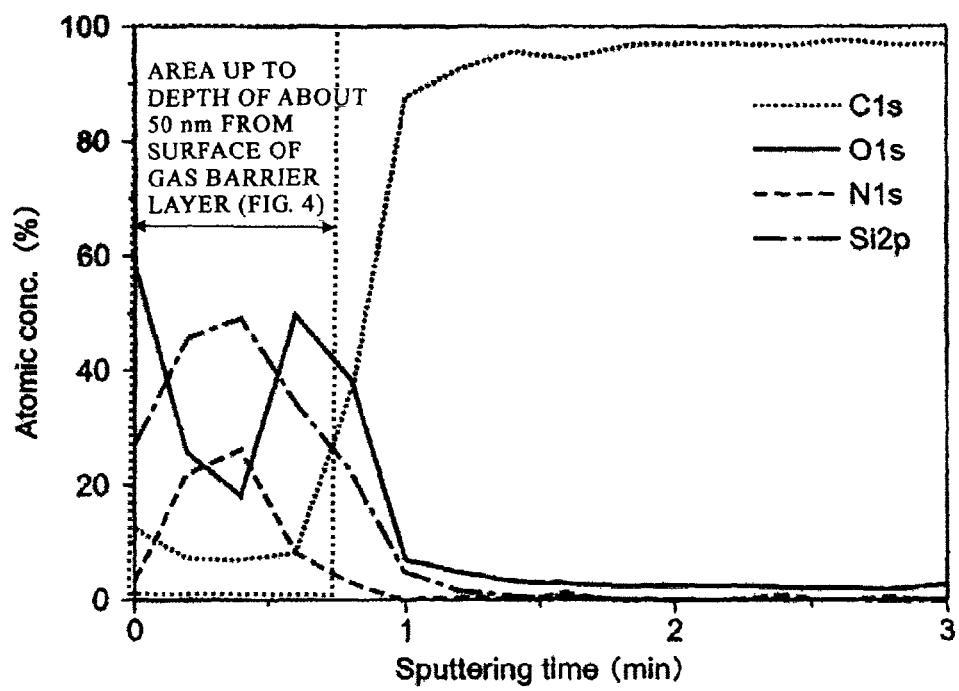
FIG. 6 is a view illustrating the oxygen atom content rate (%), the carbon atom content rate (%), the nitrogen atom content rate (%), and the silicon atom content (%) in the formed article 4r obtained in Comparative Example 4.

FIGS. 5 and 6 show the XPS elemental analysis results for the oxygen atom content rate, the nitrogen atom content rate, the carbon atom content rate, and the silicon atom content rate in the formed article 1 obtained in Example 1 and the formed article 4r obtained in Comparative Example 4. In FIGS. 5 and 6, the vertical axis indicates the oxygen atom content rate (%), the nitrogen atom content rate (%), the carbon atom content rate (%), and the silicon atom content rate (%) based on the total content rate (=100%) of oxygen atoms, nitrogen atoms, carbon atoms, and silicon atoms, and the horizontal axis indicates the cumulative sputtering time (min). Since the sputtering conditions were constant, the cumulative sputtering time corresponds to the depth from the surface of the gas barrier layer.

As is clear from the comparison between FIG. 5 and FIG. 6 (or between FIG. 3 and FIG. 4), the cumulative sputtering time required to reach a given depth (about 50 nm) from the surface of the gas barrier layer was longer in Example 1 (FIGS. 3 and 5) as compared with Comparative Example 4 (FIGS. 4 and 6). A long cumulative sputtering time indicates that it is difficult to implement sputtering (i.e., the layer is hard). It was thus confirmed that the formed article obtained in Example 1 (FIGS. 3 and 5) had an area (hard layer) that was formed of a silicon atom and an oxygen atom and did not easily allow sputtering at a given depth (about 50 nm) from the surface of the gas barrier layer.

It is considered that the formed article 1 obtained in Example 1 including the hydroxyl group-containing polymer as the primer layer had a layer of a reaction product of the polysilazane compound and the hydroxyl groups of the hydroxyl group-containing polymer at the interface between the gas barrier layer and the primer layer, and the cumulative sputtering time increased due to the above layer.

The oxygen atom content rate, the nitrogen atom content rate, and the silicon atom content rate, and the film density in the surface layer part of the gas barrier layer of the formed articles 1 to 4, 1r, 3r, and 4r obtained in Examples 1 to 4 and Comparative Examples 1, 3, and 4 were measured. The total light transmittance, the visible light transmittance, the oxygen transmission rate, and the water vapor transmission rate of the formed articles 1 to 4 and 1r to 5r obtained in Examples 1 to 4 and Comparative Examples 1 to 5 were also measured. The measurement results are shown in Table 2.

TABLE 2

| | | Gas barrier layer | | | | | | Oxygen | Water vapor |
| --- | --- | --- | --- | --- | --- | --- | --- | --- | --- |
| | | Content rate (%) | | | | Total light | Visible light | transmission | transmission |
| | Formed article | Oxygen atom | Nitrogen atom | Silicon atom | Film density (g/cm$^3$) | transmittance (%) | transmittance (550 nm) (%) | rate (cc/m$^2$/day/atm) | rate (g/m$^2$/day) |
| Example 1 | 1 | 66.8 | 2.8 | 30.4 | 2.76 | 92 | 93 | <0.02 | 0.03 |
| Example 2 | 2 | 63.0 | 5.0 | 32.0 | 3.20 | 93 | 93 | <0.02 | 0.03 |
| Example 3 | 3 | 63.3 | 5.5 | 31.2 | 3.28 | 93 | 93 | <0.02 | 0.04 |
| Example 4 | 4 | 63.2 | 4.8 | 32.0 | 3.19 | 93 | 93 | <0.02 | 0.04 |
| Comparative Example 1 | 1r | 28.8 | 24.1 | 47.1 | 1.63 | 92 | 92 | 26.9 | 11 |
| Comparative Example 2 | 2r | — | — | — | — | 66 | 67 | 25.1 | 3 |
| Comparative Example 3 | 3r | 63.1 | 5.9 | 31.0 | 3.29 | 87 | 87 | 0.04 | 0.03 |
| Comparative Example 4 | 4r | 65.6 | 4.7 | 29.7 | 2.91 | 88 | 87 | 0.04 | 0.04 |
| Comparative Example 5 | 5r | — | — | — | — | 91 | 91 | 26.1 | 12 |

As shown in Table 2, the formed articles 1 to 4 obtained in Examples 1 to 4 including the primer layer including the hydroxyl group-containing polymer, and the gas barrier layer having an oxygen atom content rate of 60 to 75%, a nitrogen atom content rate of 0 to 10%, and a silicon atom content rate of 25 to 35%, based on the total content rate of oxygen atoms, nitrogen atoms, and silicon atoms, and having a film density of 2.4 to 4.0 g/cm$^3$, had high total light transmittance and high visible light transmittance, and showed no coloration of the base layer (i.e., exhibited excellent transparency), as compared with the formed article 3r obtained in Comparative Example 3 that was not provided with the primer layer, and the formed article 4r obtained in Comparative Example 4 that was not provided with the hydroxyl group-containing polymer as the primer layer.

The formed articles 1 to 4 obtained in Examples 1 to 4 also had a low oxygen transmission rate and a low water vapor transmission rate (i.e., exhibited an excellent gas barrier capability) as compared with the formed articles 1r to 5r obtained in Comparative Examples 1 to 5.

REFERENCE SIGNS LIST

10 Base layer
20 Primer layer
30 Polysilazane layer
40 Layer of reaction product of polysilazane compound and hydroxyl groups of hydroxyl group-containing polymer 50a Ion-implanted layer (gas barrier layer)
50b Gas barrier layer
60 Ion implantation target area
100a, 100b Formed article

The invention claimed is:

1. A formed article sequentially comprising a base layer, a primer layer that includes a hydroxyl group-containing polymer, and a gas barrier layer, the gas barrier layer being formed of a material that includes at least an oxygen atom and a silicon atom, a surface layer part of the gas barrier layer having an oxygen atom content rate of 60 to 75%, a nitrogen atom content rate of 0 to 10%, and a silicon atom content rate of 25 to 35%, based on a total content rate of oxygen atoms, nitrogen atoms, and silicon atoms, and the surface layer part of the gas barrier layer having a film density of 2.4 to 4.0 g/cm$^3$.

2. The formed article according to claim 1, wherein the gas barrier layer is obtained by implanting ions into a polysilazane compound-containing layer.

3. The formed article according to claim 2, wherein the ions are obtained by ionizing at least one gas selected from the group consisting of hydrogen, nitrogen, oxygen, argon, helium, neon, xenon, and krypton.

4. The formed article according to claim 3, wherein the gas barrier layer is obtained by implanting the ions into the polysilazane compound-containing layer by a plasma ion implantation method.

5. The formed article according to claim 3, wherein the polysilazane compound is perhydropolysilazane.

6. The formed article according to claim 2, wherein the gas barrier layer is obtained by implanting the ions into the polysilazane compound-containing layer by a plasma ion implantation method.

7. The formed article according to claim 6, wherein the polysilazane compound is perhydropolysilazane.

8. The formed article according to claim 2, wherein the polysilazane compound is perhydropolysilazane.

9. The formed article according to claim 2, wherein the hydroxyl group-containing polymer has a hydroxyl group-containing repeating unit content of 10 mol % or more based on total repeating units.

10. A method for producing the formed article according to claim 2, the method comprising forming a polysilazane compound-containing layer on a primer layer that is formed on a surface of a base layer and includes a hydroxyl group-containing polymer, and implanting ions into a surface area of the polysilazane compound-containing layer.

11. The method according to claim 10, comprising forming a polysilazane compound-containing layer on a primer layer that is formed on a surface of a base layer and includes a hydroxyl group-containing polymer, and implanting ions of at least one gas selected from the group consisting of hydrogen, nitrogen, oxygen, argon, helium, neon, xenon, and krypton into a surface area of the polysilazane compound-containing layer.

12. The method according to claim 10, comprising forming a polysilazane compound-containing layer on a primer layer that is formed on a surface of a base layer and includes a hydroxyl group-containing polymer, and implanting ions of at least one gas selected from the group consisting of hydrogen, nitrogen, oxygen, argon, helium, neon, xenon, and krypton into a surface area of the polysilazane compound-containing layer by a plasma ion implantation method.

13. The formed article according to claim 1, wherein the hydroxyl group-containing polymer has a hydroxyl group-containing repeating unit content of 10 mol % or more based on total repeating units.

14. The formed article according to claim 13, wherein the ions are obtained by ionizing at least one gas selected from the group consisting of hydrogen, nitrogen, oxygen, argon, helium, neon, xenon, and krypton.

15. The formed article according to claim 13, wherein the gas barrier layer is obtained by implanting the ions into the polysilazane compound-containing layer by a plasma ion implantation method.

16. The formed article according to claim 1, the formed article having a water vapor transmission rate at a temperature of 40° C. and a relative humidity of 90% of less than 0.10 g/m$^2$/day.

17. The formed article according to claim 1, the formed article having a total light transmittance measured in accordance with JIS K 7361-1 of 90% or more.

18. An electronic device member comprising the formed article according to claim 1.

19. An electronic device comprising the electronic device member according to claim 18.

* * * * *